US012334969B2

(12) United States Patent
Uejima (10) Patent No.: US 12,334,969 B2
(45) Date of Patent: Jun. 17, 2025

(54) RADIO-FREQUENCY MODULE AND COMMUNICATION DEVICE

(71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 386 days.

(21) Appl. No.: 18/167,284

(22) Filed: Feb. 10, 2023

(65) Prior Publication Data

US 2023/0188171 A1 Jun. 15, 2023

Related U.S. Application Data

(63) Continuation of application No. PCT/JP2021/019674, filed on May 24, 2021.

(30) Foreign Application Priority Data

Aug. 27, 2020 (JP) ................ 2020-143730

(51) Int. Cl.
*H04B 1/38* (2015.01)
*H03F 3/24* (2006.01)
(Continued)

(52) U.S. Cl.
CPC ............... *H04B 1/38* (2013.01); *H03F 3/245* (2013.01); *H03F 2200/171* (2013.01); *H03F 2200/294* (2013.01); *H03F 2200/451* (2013.01)

(58) Field of Classification Search
None
See application file for complete search history.

(56) References Cited

U.S. PATENT DOCUMENTS 7,102,896 B2 * 9/2006 Ajioka ................ H01L 23/552
257/E23.114
8,767,859 B2 * 7/2014 Fukamachi ......... H01P 1/20336
375/267
(Continued)

FOREIGN PATENT DOCUMENTS

JP 2004-342949 A 12/2004
JP 2014-522216 A 8/2014
(Continued)

OTHER PUBLICATIONS

International Search Report for PCT/JP2021/019674 dated Aug. 24, 2021.

*Primary Examiner* — Pablo N Tran
(74) *Attorney, Agent, or Firm* — McDonald Hopkins LLC (57) ABSTRACT

A radio-frequency module includes power amplifiers on a major surface of a module substrate, a transmit filter coupled to an output terminal of the power amplifier to pass a transmit signal in a communication band A, a transmit filter coupled to an output terminal of the power amplifier to pass a transmit signal in a communication band C, a transmit filter coupled to an output terminal of the power amplifier to pass a transmit signal in a communication band E, a resin member covering the major surface, a metal shield layer covering a surface of the resin member, and a metal shield plate on the major surface between the power amplifier and the power amplifier and also between the power amplifier and the power amplifier. The metal shield plate is in contact with a first ground electrode at the major surface and also with the metal shield layer.

11 Claims, 5 Drawing Sheets (51) Int. Cl.
    *H04B 1/00*           (2006.01)
    *H04B 1/04*           (2006.01)

(56)         References Cited

U.S. PATENT DOCUMENTS

| | | |
|---|---|---|
| 10,511,268 B2 * | 12/2019 | Kim .................. H01L 23/66 |
| 11,638,346 B2 * | 4/2023 | Kang ................ H01L 23/3128 |
| | | 361/782 |
| 11,664,839 B2 * | 5/2023 | Pehlivanoglu ............ H04L 5/14 |
| | | 370/329 |
| 11,804,816 B2 * | 10/2023 | Ayranci .............. H04B 1/0053 |
| 11,881,876 B2 * | 1/2024 | Yamaguchi ............ H04B 1/525 |
| 11,901,307 B2 * | 2/2024 | Chuang .............. H01L 23/3128 |
| 11,968,815 B2 * | 4/2024 | Nomura .................. H01L 25/16 |
| 11,990,968 B2 * | 5/2024 | Chen ...................... H04B 7/068 |
| 12,107,616 B2 * | 10/2024 | Nakazawa ............. H03F 3/245 |
| 12,107,619 B2 * | 10/2024 | Khlat ...................... H04L 5/14 |
| 2004/0233648 A1 | 11/2004 | Ajioka et al. |
| 2011/0110452 A1 | 5/2011 | Fukamachi et al. |
| 2012/0320559 A1 * | 12/2012 | Kimura ................ H01L 23/552 |
| | | 361/818 |
| 2013/0043946 A1 | 2/2013 | Hadjichristos et al. |

FOREIGN PATENT DOCUMENTS

| | | |
|---|---|---|
| WO | 2009/157357 A1 | 12/2009 |
| WO | 2011/111318 A1 | 9/2011 |

\* cited by examiner

RADIO-FREQUENCY MODULE AND COMMUNICATION DEVICE

CROSS REFERENCE TO RELATED APPLICATION

This is a continuation of International Application No. PCT/JP2021/019674 filed on May 24, 2021 which claims priority from Japanese Patent Application No. 2020-143730 filed on Aug. 27, 2020. The contents of these applications are incorporated herein by reference in their entireties.

BACKGROUND ART

Technical Field

The present disclosure relates to a radio-frequency module and a communication device.

In mobile communication devices, such as mobile phones, particularly along with the development of multiband communication, the arrangement of circuit elements constituting a radio-frequency front-end circuit has become complex.

Patent Document 1 discloses a circuit configuration of a transceiver (transmit and receive circuit) including a plurality of transmitters (transmit paths) and a plurality of receivers (receive paths), and a switchplexer (antenna switch) positioned between the plurality of transmitters and the plurality of receivers, and an antenna. Each transmitter includes a transmit circuit, a transmit power amplifier (PA), and an output circuit. Each receiver includes a receive circuit, a receive low-noise amplifier (LNA), and an input circuit. The output circuit includes elements such as a transmit filter, an impedance matching circuit, and a duplexer. The input circuit includes elements such as a receive filter, an impedance matching circuit, and a duplexer. With the configuration described above, by switching the switchplexer, simultaneous transmission, simultaneous reception, or simultaneous transmission and reception is provided.

Patent Document 1: Japanese Unexamined Patent Application Publication (Translation of PCT Application) No. 2014-522216

BRIEF SUMMARY

However, when the transceiver (transmit and receive circuit) disclosed in Patent Document 1 is implemented by a radio-frequency module installed in a mobile communication device, harmonic waves of a high-power transmit signal amplified by the PA (transmit power amplifier) can be superimposed on the transmit signal, and as a result, the quality of transmit signal can be degraded. Furthermore, the inductors provided in the individual transmit paths and receive paths are coupled to each other via electromagnetic fields, so that isolation between the transmit side and the receive side becomes weak. As a result, harmonic waves of a transmit signal or spurious waves such as intermodulation distortion between a transmit signal and other radio-frequency signals flow into the receive paths, and the receive sensitivity can be degraded.

The present disclosure provides a radio-frequency module and a communication device in which quality deterioration of transmit signal or receive signal is reduced.

A radio-frequency module according to an embodiment of the present disclosure includes a module substrate having a first major surface, a first power amplifier disposed on the first major surface, a second power amplifier disposed on the first major surface, a third power amplifier disposed on the first major surface, a first filter coupled to an output terminal of the first power amplifier and configured to pass a transmit signal in a first communication band, a second filter coupled to an output terminal of the second power amplifier and configured to pass a transmit signal in a second communication band that is different from the first communication band, a third filter coupled to an output terminal of the third power amplifier and configured to pass a transmit signal in a third communication band that is different from the first communication band and the second communication band, a resin member covering at least a portion of the first major surface, a metal shield layer that covers a surface of the resin member and that is set at a ground potential, a first metal shield plate disposed on the first major surface between the first power amplifier and the second power amplifier when the module substrate is viewed in plan view, and a second metal shield plate disposed on the first major surface between the first power amplifier and the third power amplifier when the module substrate is viewed in plan view. The first metal shield plate is in contact with a first ground electrode at the first major surface and also with the metal shield layer. The second metal shield plate is in contact with a second ground electrode at the first major surface and also with the metal shield layer.

The present disclosure provides a radio-frequency module and a communication device in which quality deterioration of transmit signal or receive signal is reduced.

DETAILED DESCRIPTION

Hereinafter, an embodiment of the present disclosure will be described in detail. It should be noted that the embodiment described below is a comprehensive or specific instance. The numerical values, the shapes, the materials, the constituent elements, the arrangements of the constituent elements, and the modes of connection, and the like given in the following embodiment and practical examples are mere instances and are not intended to limit the present disclosure. Among the constituent elements in the following practical examples, constituent elements not recited in any of the independent claims are described as arbitrary constituent elements. The size or size ratio of the constituent elements illustrated in the drawings is not necessarily presented in an exact manner. Like reference symbols are used to denote substantially like configurations in the drawings, and redundant descriptions thereof may be omitted or simplified.

In the following description, words used to express relationships between elements, such as parallel and vertical, words used to express the shape of an element, such as rectangular, and numerical ranges do not necessarily denote the exact meanings but denote substantially the same meanings involving, for example, several percent differences.

In the drawings described below, the X axis and the Y axis are axes perpendicular to each other in a plane parallel to major surfaces of a module substrate. The Z axis is an axis perpendicular to major surfaces of a module substrate; the forward direction of the Z axis indicates an upward direction, and the reverse direction of the Z axis indicates a downward direction.

Regarding the circuit configuration of the present disclosure, the expression "coupled" includes not only the case in which a circuit element is directly coupled to another circuit element by using a connection terminal and/or an interconnection conductor but also the case in which a circuit element is electrically coupled to another circuit element via still another circuit element. The expression "coupled between A and B" denotes that a circuit element is coupling to both A and B while the circuit element is positioned between A and B.

Regarding the module configuration of the present disclosure, the expression "plan view" denotes that an object orthogonally projected on an xy plane is viewed from the front side in the positive direction of the Z axis. The expression "a component is disposed at a major surface of a substrate" includes the case in which the component is positioned in contact with the major surface of the substrate, the case in which the component is positioned over the major surface without necessarily contact with the major surface, and the case in which the component is partially embedded in the substrate at the major surface. The expression "A is positioned between B and C" denotes that at least one of line segments each connecting a point of B and a point of C passes A. Additionally, words used to express relationships between elements, such as "parallel" and "vertical", and words used to express the shape of an element, such as "rectangular" do not necessarily denote the exact meanings but denote substantially the same meanings involving, for example, several percent differences.

In the following description, "transmit path" denotes a communication line constituted by, for example, an interconnection through which a radio-frequency transmit signal is communicated, an electrode directly coupled to the interconnection, and a terminal directly coupled to the interconnection or the electrode. Similarly, "receive path" denotes a communication line constituted by, for example, an interconnection through which a radio-frequency receive signal is communicated, an electrode directly coupled to the interconnection, and a terminal directly coupled to the interconnection or the electrode. Similarly, "transmit and receive path" denotes a communication line constituted by, for example, an interconnection through which both a radio-frequency transmit signal and a radio-frequency receive signal are communicated, an electrode directly coupled to the interconnection, and a terminal directly coupled to the interconnection or the electrode.

EMBODIMENT

1 Circuit Configuration of Radio-Frequency Module 1 and Communication Device 5

Figure 1:
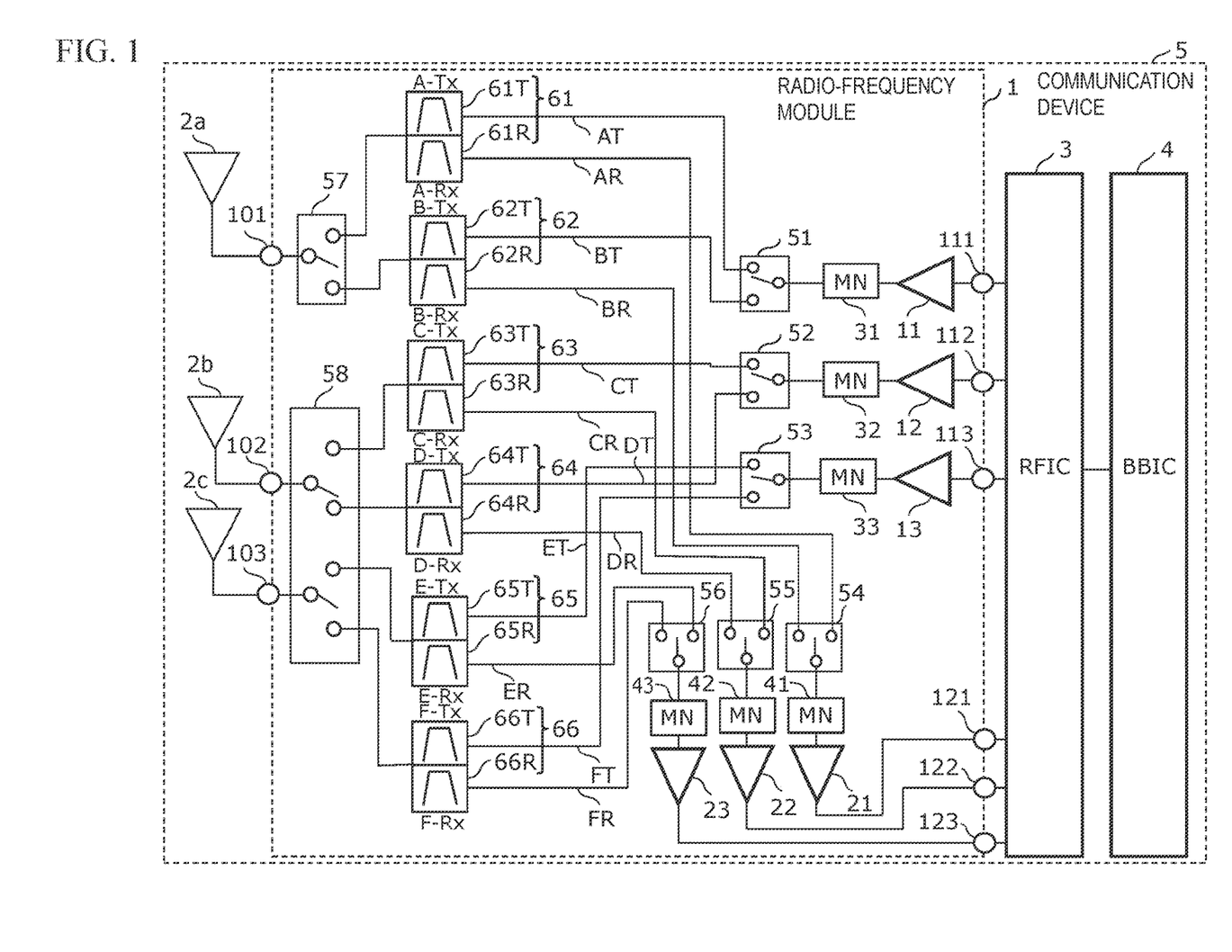
FIG. 1 is a circuit configuration diagram of a radio-frequency module and a communication device according to an embodiment.

FIG. 1 is a circuit configuration diagram of a radio-frequency module 1 and a communication device 5 according to an embodiment. As illustrated in the drawing, the communication device 5 includes the radio-frequency module 1, antennas 2a, 2b, and 2c, a radio-frequency (RF) signal processing circuit (RFIC) 3, and a baseband signal processing circuit (BBIC) 4.

The RFIC 3 is a radio-frequency signal processing circuit for processing radio-frequency signals received or to be transmitted by the antennas 2a to 2c. Specifically, the RFIC 3 processes a receive signal inputted through a receive path of the radio-frequency module 1 by for example, downconversion and outputs the receive signal generated by the signal processing to the BBIC 4. The RFIC 3 also processes a transmit signal inputted from the BBIC 4 by, for example, upconversion and outputs the transmit signal generated by the signal processing to a transmit path of the radio-frequency module 1.

The BBIC 4 performs signal processing using an intermediate frequency band lower than radio-frequency signals transferred in the radio-frequency module 1. The signal processed by the BBIC 4 is used as, for example, an image signal for displaying an image or a sound signal for talk through a speaker.

The RFIC 3 functions as a controller for controlling connections of the switches 51, 52, 53, 54, 55, 56, 57, and 58 included in the radio-frequency module 1 based on the communication band (frequency band) used. Specifically, the RFIC 3 controls connections of the switches 51 to 58 included in the radio-frequency module 1 by using a control signal (not illustrated in the drawing). The controller may be provided outside the RFIC 3; for example, the controller may be provided in the radio-frequency module 1 or the BBIC 4.

The antenna 2a is coupled to an antenna connection terminal 101 of the radio-frequency module 1. The antenna 2b is coupled to an antenna connection terminal 102 of the radio-frequency module 1. The antenna 2c is coupled to an antenna connection terminal 103 of the radio-frequency module 1. The antennas 2a to 2c emit radio-frequency signals outputted from the radio-frequency module 1. The antennas 2a to 2c receive radio-frequency signals from outside and output the radio-frequency signals to the radio-frequency module 1.

In the communication device 5 according to the present embodiment, the antennas 2a to 2c and the BBIC 4 are optional constituent elements.

The following describes a detailed configuration of the radio-frequency module 1.

As illustrated in FIG. 1, the radio-frequency module 1 includes power amplifiers 11, 12 and 13, low-noise amplifiers 21, 22, and 23, transmit filters 61T, 62T, 63T, 64T, 65T, and 66T, receive filters 61R, 62R, 63R, 64R, 65R, and 66R, matching networks 31, 32, 33, 41, 42, and 43, the switches 51, 52, 53, 54, 55, 56, 57, and 58, the antenna connection terminals 101, 102, and 103, transmit input terminals 111, 112, and 113, and receive output terminals 121, 122, and 123.

The power amplifier 11 is an example of a first power amplifier. The power amplifier 11 amplifies transmit signals in communication bands A and B. An input terminal of the power amplifier 11 is coupled to the transmit input terminal 111. An output terminal of the power amplifier 11 is coupled to the transmit filters 61T and 62T via the matching network 31 and the switch 51.

The power amplifier 12 is an example of a second power amplifier. The power amplifier 12 amplifies transmit signals in communication bands C and D higher in frequency than the communication bands A and B. An input terminal of the power amplifier 12 is coupled to the transmit input terminal 112. An output terminal of the power amplifier 12 is coupled to the transmit filters 63T and 64T via the matching network 32 and the switch 52.

The power amplifier 13 is an example of a third power amplifier. The power amplifier 13 amplifies transmit signals in communication bands E and F higher in frequency than the communication bands A and B. An input terminal of the power amplifier 13 is coupled to the transmit input terminal 113. An output terminal of the power amplifier 13 is coupled to the transmit filters 65T and 66T via the matching network 33 and the switch 53.

The communication bands A and B are an example of a first communication band. The communication bands A and B are, for example, communication bands of a low-band group. The communication bands C and D are an example of a second communication band. The communication bands C and D are, for example, communication bands of a middle-band group. The communication bands E and F are an example of a third communication band. The communication bands E and F are, for example, communication bands of a high-band group.

The low-band group is a frequency-band group composed of a plurality of communication bands for the fourth generation (4G) and fifth generation (5G) technology standards. The low-band group covers, for example, a frequency range of 1 GHz or lower. As the communication bands A and B of the low-band group, for example, communication bands including Band 5 (transmit band: 824-849 MHz, receive band: 869-894 MHz), Band 8 (transmit band: 880-915 MHz, receive band: 925-960 MHz), and Band 28 (transmit band: 703-748 MHz, receive band: 753-803 MHz) of Long Term Evolution (LTE) are usable.

The middle-band group is a frequency-band group composed of a plurality of communication bands for the 4G and 5G technology standards. The middle-band group covers, for example, a frequency range of 1.5-2.2 GHz. As the communication bands C and D of the middle-band group, for example, communication bands including LTE Band 1 (transmit band: 1920-1980 MHz, receive band: 2110-2170 MHz), Band 39 (transmit and receive band: 1880-1920 MHz), and Band 66 (transmit band: 1710-1780 MHz, receive band: 2110-2200 MHz) are usable.

The high-band group is a frequency-band group composed of a plurality of communication bands for the 4G and 5G technology standards. The high-band group covers, for example, a frequency range of 2.4-2.8 GHz. As the communication bands E and F of the high-band group, for example, communication bands including LTE Band 7 (transmit band: 2500-2570 MHz, receive band: 2620-2690 MHz) and Band 41 (transmit and receive band 2496-2690 MHz) are usable.

The communication bands A to F are frequency bands determined by a standards organization (for example, 3GPP or Institute of Electrical and Electronics Engineers (IEEE)) or the like for communication systems constructed using a radio access technology (RAT). In the present embodiment, for example, an LTE system, SGNR system, or wireless local area network (WLAN) system is usable as a communication system, but these are not to be interpreted as limiting.

The communication bands A to F each includes a transmit band and a receive band. As used herein, a transmit band refers to a frequency range specified for uplink of a communication band. Similarly, a receive band refers to a frequency range specified for downlink of a communication band.

The low-noise amplifier 21 is an example of a first low-noise amplifier. The low-noise amplifier 21 amplifies receive signals in the communication bands A and B with low noise. An input terminal of the low-noise amplifier 21 is coupled to the receive filters 61R and 62R via the matching network 41 and the switch 54. An output terminal of the low-noise amplifier 21 is coupled to the receive output terminal 121.

The low-noise amplifier 22 is an example of a second low-noise amplifier. The low-noise amplifier 22 amplifies receive signals in the communication bands C and D with low noise. An input terminal of the low-noise amplifier 22 is coupled to the receive filters 63R and 64R via the matching network 42 and the switch 55. An output terminal of the low-noise amplifier 22 is coupled to the receive output terminal 122.

The low-noise amplifier 23 is an example of a third low-noise amplifier. The low-noise amplifier 23 amplifies receive signals in the communication bands E and F with low noise. An input terminal of the low-noise amplifier 23 is coupled to the receive filters 65R and 66R via the matching network 43 and the switch 56. An output terminal of the low-noise amplifier 23 is coupled to the receive output terminal 123.

The transmit filter 61T is an example of a first filter. The transmit filter 61T is provided in a transmit path AT connecting the transmit input terminal 111 and the switch 57 and coupled to the power amplifier 11 via the switch 51 and the matching network 31. The transmit filter 61T passes transmit signals in the transmit band of the communication band A out of transmit signals amplified by the power amplifier 11.

The transmit filter 62T is an example of the first filter. The transmit filter 62T is provided in a transmit path BT connecting the transmit input terminal 111 and the switch 57 and coupled to the power amplifier 11 via the switch 51 and the matching network 31. The transmit filter 62T passes transmit signals in the transmit band of the communication band B out of transmit signals amplified by the power amplifier 11. The transmit paths AT and BT are an example of a first transmit path for transferring transmit signals of the low-band group.

The transmit filter 63T is an example of a second filter. The transmit filter 63T is provided in a transmit path CT connecting the transmit input terminal 112 and the switch 58 and coupled to the power amplifier 12 via the switch 52 and the matching network 32. The transmit filter 63T passes transmit signals in the transmit band of the communication band C out of transmit signals amplified by the power amplifier 12.

The transmit filter 64T is an example of the second filter. The transmit filter 64T is provided in a transmit path DT connecting the transmit input terminal 112 and the switch 58 and coupled to the power amplifier 12 via the switch 52 and the matching network 32. The transmit filter 64T passes transmit signals in the transmit band of the communication band D out of transmit signals amplified by the power amplifier 12. The transmit paths CT and DT are an example of a second transmit path for transferring transmit signal of the middle-band group.

The transmit filter 65T is an example of a third filter. The transmit filter 65T is provided in a transmit path ET connecting the transmit input terminal 113 and the switch 58 and coupled to the power amplifier 13 via the switch 53 and the matching network 33. The transmit filter 65T passes transmit signals in the transmit band of the communication band E out of transmit signals amplified by the power amplifier 13.

The transmit filter 66T is an example of the third filter. The transmit filter 66T is provided in a transmit path FT connecting the transmit input terminal 113 and the switch 58 and coupled to the power amplifier 13 via the switch 53 and the matching network 33. The transmit filter 66T passes transmit signals in the transmit band of the communication band F out of transmit signals amplified by the power amplifier 13. The transmit paths ET and FT are an example of a third transmit path for transferring transmit signals of the high-band group.

The receive filter 61R is provided in a receive path AR connecting the switch 57 and the receive output terminal 121 and coupled to the low-noise amplifier 21 via the switch 54 and the matching network 41. The receive filter 61R passes receive signals in the receive band of the communication band A out of receive signals inputted from the antenna connection terminal 101.

The receive filter 62R is provided in a receive path BR connecting the switch 57 and the receive output terminal 121 and coupled to the low-noise amplifier 21 via the switch 54 and the matching network 41. The receive filter 62R passes receive signals in the receive band of the communication band B out of receive signals inputted from the antenna connection terminal 101. The receive path AR and BR is an example of a first receive path for transferring receive signals of the low-band group.

The receive filter 63R is an example of a fourth filter. The receive filter 63R is provided in a receive path CR connecting the switch 58 and the receive output terminal 122 and coupled to the low-noise amplifier 22 via the switch 55 and the matching network 42. The receive filter 63R passes receive signals in the receive band of the communication band C out of receive signals inputted from the antenna connection terminal 102 or 103.

The receive filter 64R is an example of the fourth filter. The receive filter 64R is provided in a receive path DR connecting the switch 58 and the receive output terminal 122 and coupled to the low-noise amplifier 22 via the switch 55 and the matching network 42. The receive filter 64R passes receive signals in the receive band of the communication band D out of receive signals inputted from the antenna connection terminal 102 or 103. The receive path CR and DR is an example of a second receive path for transferring receive signals of the middle-band group.

The receive filter 65R is an example of a fifth filter. The receive filter 65R is provided in a receive path ER connecting the switch 58 and the receive output terminal 123 and coupled to the low-noise amplifier 23 via the switch 56 and the matching network 43. The receive filter 65R passes receive signals in the receive band of the communication band E out of receive signals inputted from the antenna connection terminal 102 or 103.

The receive filter 66R is an example of the fifth filter. The receive filter 66R is provided in a receive path FR connecting the switch 58 and the receive output terminal 123 and coupled to the low-noise amplifier 23 via the switch 56 and the matching network 43. The receive filter 66R passes receive signals in the receive band of the communication band F out of receive signals inputted from the antenna connection terminal 102 or 103. The receive path ER and FR is an example of a third receive path for transferring receive signals of the high-band group.

The transmit filter 61T and the receive filter 61R form a duplexer 61 of the pass band of the communication band A. The transmit filter 62T and the receive filter 62R form a duplexer 62 of the pass band of the communication band B. The transmit filter 63T and the receive filter 63R form a duplexer 63 of the pass band of the communication band C. The transmit filter 64T and the receive filter 64R form a duplexer 64 of the pass band of the communication band D. The transmit filter 65T and the receive filter 65R form a duplexer 65 of the pass band of the communication band E. The transmit filter 66T and the receive filter 66R form a duplexer 66 of the pass band of the communication band F.

In the radio-frequency module 1 according to the present embodiment, the transmit filters and receive filters of the individual communication bands form duplexers for transferring transmit signals and receive signals by frequency division duplex (FDD), but transmit signals and receive signals may be transferred by time division duplex (TDD). In this case, a switch for switching transmission and reception is provided in at least either the stage before the transmit filter and receive filter or the stage after the transmit filter and receive filter.

The transmit filters 61T to 66T and the receive filters 61R to 66R described above may be, but not limited to, for example, surface acoustic wave filters, acoustic wave filters using a bulk acoustic wave (BAW), LC resonance filters, or dielectric filters.

The matching network 31 is coupled between the power amplifier 11 and the transmit filters 61T and 62T. The matching network 31 provides impedance matching between the power amplifier 11 and the transmit filters 61T and 62T. The matching network 31 includes at least a first inductor.

The matching network 32 is coupled between the power amplifier 12 and the transmit filters 63T and 64T. The matching network 32 provides impedance matching between the power amplifier 12 and the transmit filters 63T and 64T. The matching network 32 includes at least a second inductor.

The matching network 33 is coupled between the power amplifier 13 and the transmit filters 65T and 66T. The matching network 33 provides impedance matching between the power amplifier 13 and the transmit filters 65T and 66T. The matching network 33 includes at least a third inductor.

The matching network 41 is coupled between the low-noise amplifier 21 and the receive filters 61R and 62R. The matching network 41 provides impedance matching between the low-noise amplifier 21 and the receive filters 61R and 62R.

The matching network 42 is coupled between the low-noise amplifier 22 and the receive filters 63R and 64R. The matching network 42 provides impedance matching between the low-noise amplifier 22 and the receive filters 63R and 64R. The matching network 42 includes at least a fourth inductor.

The matching network 43 is coupled between the low-noise amplifier 23 and the receive filters 65R and 66R. The matching network 43 provides impedance matching between the low-noise amplifier 23 and the receive filters 65R and 66R. The matching network 43 includes at least a fifth inductor.

The switch 51 is coupled between the matching network 31 and the transmit filters 61T and 62T. The switch 51 selectively connects the power amplifier 11 to the transmit filter 61T or 62T. The switch 51 is implemented by, for example, a single-pole double-throw (SPDT) switching circuit having a common terminal coupled to the matching network 31, one selection terminal coupled to the transmit filter 61T, and another selection terminal coupled to the transmit filter 62T.

The switch 52 is coupled between the matching network 32 and the transmit filters 63T and 64T. The switch 52 selectively connects the power amplifier 12 to the transmit filter 63T or 64T. The switch 52 is implemented by, for example, an SPDT switching circuit having a common terminal coupled to the matching network 32, one selection terminal coupled to the transmit filter 63T, and another selection terminal coupled to the transmit filter 64T.

The switch 53 is coupled between the matching network 33 and the transmit filters 65T and 66T. The switch 53 selectively connects the power amplifier 13 to the transmit filter 65T or 66T. The switch 53 is implemented by, for example, an SPDT switching circuit having a common terminal coupled to the matching network 33, one selection terminal coupled to the transmit filter 65T, and another selection terminal coupled to the transmit filter 66T.

The switch 54 is coupled between the matching network 41 and the receive filters 61R and 62R. The switch 54 selectively connects the low-noise amplifier 21 to the receive filter 61R or 62R. The switch 54 is implemented by, for example, an SPDT switching circuit having a common terminal coupled to the matching network 41, one selection terminal coupled to the receive filter 61R, and another selection terminal coupled to the receive filter 62R.

The switch 55 is coupled between the matching network 42 and the receive filters 63R and 64R. The switch 55 selectively connects the low-noise amplifier 22 to the receive filter 63R or 64R. The switch 55 is implemented by, for example, an SPDT switching circuit having a common terminal coupled to the matching network 42, one selection terminal coupled to the receive filter 63R, and another selection terminal coupled to the receive filter 64R.

The switch 56 is coupled between the matching network 43 and the receive filters 65R and 66R. The switch 56 selectively connects the low-noise amplifier 23 to the receive filter 65R or 66R. The switch 56 is implemented by, for example, an SPDT switching circuit having a common terminal coupled to the matching network 43, one selection terminal coupled to the receive filter 65R, and another selection terminal coupled to the receive filter 66R.

The switch 57 is coupled between the antenna connection terminal 101 and the duplexers 61 and 62. The switch 57 selectively connects the antenna 2a to the duplexer 61 or 62. The switch 57 is implemented by, for example, an SPDT switching circuit having a common terminal coupled to the antenna connection terminal 101, one selection terminal coupled to the duplexer 61, and another selection terminal coupled to the duplexer 62.

The switch 58 is coupled between the antenna connection terminals 102 and 103 and the duplexers 63 to 66. The switch 58 selectively connects the antenna 2b to any of the duplexers 63 to 66 and selectively connects the antenna 2c to any of the duplexers 63 to 66. The switch 58 is implemented by, for example, a double-pole 4-throw (DP4T) switching circuit having one common terminal coupled to the antenna connection terminal 102, another common terminal coupled to the antenna connection terminal 103, a first selection terminal coupled to the duplexer 63, a second selection terminal coupled to the duplexer 64, a third selection terminal coupled to the duplexer 65, and a fourth selection terminal coupled to the duplexer 66.

The power amplifiers 11 to 13 and the low-noise amplifiers 21 to 23 are implemented by, for example, field-effect transistors (FET) or heterojunction bipolar transistors (HBT) made of a Si-based complementary metal oxide semiconductor (CMOS) material or GaAs.

The low-noise amplifier 21 and the switches 54 and 57 may be formed in one semiconductor integrated circuit (IC). The low-noise amplifiers 22 and 23 and the switches 55, 56, and 58 may be formed in one semiconductor IC. The semiconductor ICs are formed by, for example, CMOS. Specifically, the semiconductor ICs are formed by silicon on insulator (SOI) process. In this manner, the semiconductor ICs can be inexpensively manufactured. The semiconductor ICs may also be made of at least any of GaAs, SiGe, and GaN. This enables output of radio-frequency signals with high amplification performance and low-noise performance.

In the circuit configuration of the radio-frequency module 1, the power amplifier 11, the matching network 31, the switch 51, the transmit filters 61T and 62T, and the switch 57 form a first transmit circuit for outputting transmit signals of the low-band group (the communication bands A and B) to the antenna connection terminal 101. The power amplifier 12, the matching network 32, the switch 52, the transmit filters 63T and 64T, and the switch 58 form a second transmit circuit for outputting transmit signals of the middle-band group (the communication bands C and D) to the antenna connection terminal 102 or 103. The power amplifier 13, the matching network 33, the switch 53, the transmit filters 65T and 66T, and the switch 58 form a third transmit circuit for outputting transmit signals of the high-band group (the communication bands E and F) to the antenna connection terminal 102 or 103.

The low-noise amplifier 21, the matching network 41, the switch 54, the receive filters 61R and 62R, and the switch 57 form a first receive circuit for inputting receive signals of the low-band group (the communication bands A and B) from the antenna 2a through the antenna connection terminal 101. The low-noise amplifier 22, the matching network 42, the switch 55, the receive filters 63R and 64R, and the switch 58 form a second receive circuit for inputting receive signals of the middle-band group (the communication bands C and D) from the antenna 2b or 2c through the antenna connection terminal 102 or 103. The low-noise amplifier 23, the matching network 43, the switch 56, the receive filters 65R and 66R, and the switch 58 form a third receive circuit for inputting receive signals of the high-band group (the communication bands E and F) from the antenna 2b or 2c through the antenna connection terminal 102 or 103.

The first transmit circuit and the first receive circuit constitute a first transfer circuit for transferring radio-frequency signals of the low-band group. The second transmit circuit and the second receive circuit constitute a second transfer circuit for transferring radio-frequency signals of the middle-band group. The third transmit circuit and the third receive circuit constitute a third transfer circuit for transferring radio-frequency signals of the high-band group.

With the circuit configuration described above, the radio-frequency module 1 according to the present embodiment is operable to provide at least any of simultaneous transmission, simultaneous reception, or simultaneous transmission and reception of at least two of radio-frequency signals of the low-band group, radio-frequency signals of the middle-band group, and radio-frequency signals of the high-band group.

In the radio-frequency module according to the present disclosure, the transmit circuits and receive circuits are not necessarily coupled to the antenna connection terminals 101 to 103 via the switches 57 and 58; the transmit circuits and receive circuits may be coupled to the antennas 2a to 2c via other terminals. It is sufficient that the circuit configuration of the radio-frequency module according to the present disclosure include at least the power amplifiers 11 to 13 and the transmit filters 61T, 63T, and 65T.

The antennas 2a to 2c may be a single antenna. In this case, the single antenna may be coupled to the duplexers 61 and 66 via a switch. Additionally, between the single antenna and the switch, a triplexer for dividing or combining low-band-group signals, middle-band-group signals, and high-band-group signals may be provided.

When the circuit elements constituting the radio-frequency module 1 are formed as one module, for example, harmonic waves of a high-power transmit signal of the low-band group amplified by the power amplifier 11 can be superimposed on a transmit signal of the middle-band group or the high-band group, and as a result, the quality of transmit signal is degraded.

For example, harmonic waves of a transmit signal of the low-band group can flow into the second receive circuit for the middle-band group or the third receive circuit for the high-band group, and as a result, the receive sensitivity of the second receive circuit or the third receive circuit is degraded in some cases. One example is the case in which the frequencies of harmonic waves of a transmit signal amplified by the power amplifier 11 coincide with at least a portion of the frequency range of the middle-band group or a portion of the frequency range of the high-band group. Another example is the case in which the frequencies of intermodulation distortion between a transmit signal amplified by the power amplifier 11 and other radio-frequency signals coincide with at least a portion of the frequency range of the middle-band group or a portion of the frequency range of the high-band group. Overall, there is the case in which the frequencies of mth (m is an integer greater than or equal to 2) harmonic waves of low-band-group signals are included in the frequency range of the middle-band group, and the frequencies of nth (n is an integer greater than or equal to 2) harmonic waves of low-band-group signals are included in the frequency range of the high-band group.

In this regard, the radio-frequency module 1 according to the present embodiment has a structure that inhibits electromagnetic field coupling between the first transmit circuit for the low-band group, and the second transfer circuit for the middle-band group and the third transfer circuit for the high-band group. The following describes a structure of the radio-frequency module 1 according to the present embodiment that inhibits the electromagnetic field coupling described above.

Figure 2:
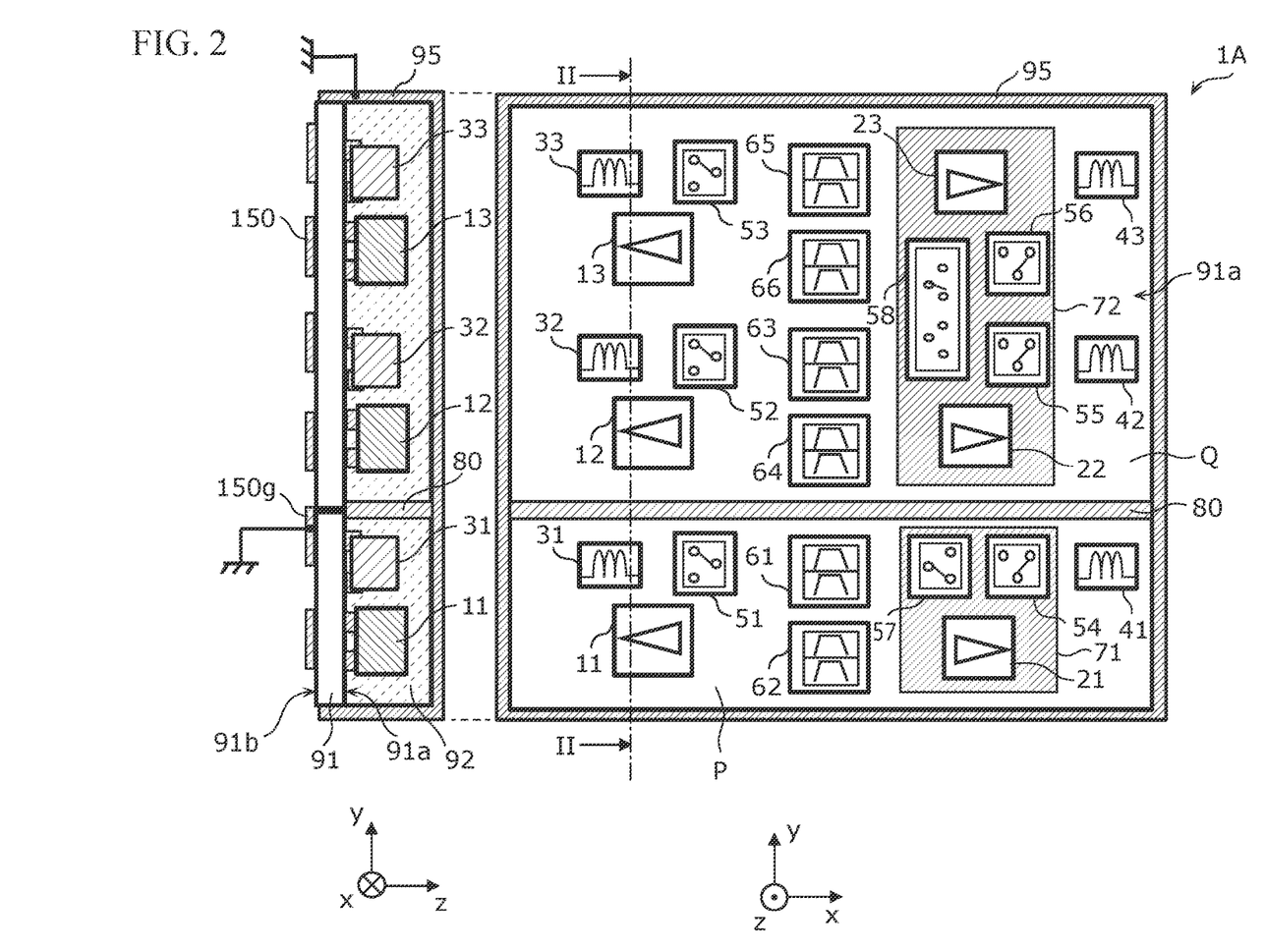
FIG. 2 provides a plan view and a sectional view of a radio-frequency module according to a first practical example.

2 Arrangement of Circuit Components of Radio-Frequency Module 1A According to First Practical Example FIG. 2 provides a plan view and a sectional view of a radio-frequency module 1A according to a first practical example. The right side of FIG. 2 provides a drawing illustrating an arrangement of circuit components when a major surface 91a of a module substrate 91 is viewed from the front side in the positive direction of the Z axis. The left side of FIG. 2 provides a sectional view taken along line II-II in the right drawing in FIG. 2. The radio-frequency module 1A specifically presents an arrangement of the circuit components of the radio-frequency module 1 according to the embodiment.

As illustrated in FIG. 2, the radio-frequency module 1A according to this practical example includes, as well as the circuit configuration illustrated in FIG. 1, the module substrate 91, a metal shield plate 80, a metal shield layer 95, a resin member 92, and external connection terminals 150.

The module substrate 91 has the major surface 91a (a first major surface); the first to third transfer circuits are provided at the major surface 91a. For example, a low temperature co-fired ceramic (LTCC) substrate having a layered structure of a plurality of dielectric layers, a high temperature co-fired ceramic (HTCC) substrate, a component-embedded substrate, a substrate including a redistribution layer (RDL), or a printed-circuit board is usable as the module substrate 91.

The resin member 92 is disposed on the major surface 91a of the module substrate 91 to cover at least a portion of the circuit components forming the first to third transfer circuits and also cover the major surface 91a of the module substrate 91. The resin member 92 functions to secure the reliability including, for example, the mechanical strength and moisture resistance of the circuit components.

The external connection terminals 150 are disposed on a major surface 91b of the module substrate 91. The radio-frequency module 1A exchanges electrical signals with an external substrate provided on the front side in the negative direction of the Z axis with respect to the radio-frequency module 1A, through the plurality of external connection terminals 150. A ground terminal 150g of the plurality of external connection terminals 150 is set at a ground potential of the external substrate. The external connection terminals 150 may be planar electrodes formed on the major surface 91b as illustrated in FIG. 2 or may be bump electrodes formed on the major surface 91b.

As illustrated in FIG. 2, in the radio-frequency module 1A according to this practical example, the power amplifiers 11 to 13, the low-noise amplifiers 21 to 23, the duplexers 61 and 66, the matching networks 31 to 33 and 41 to 43, and the switches 51 to 58 are arranged on the major surface 91a of the module substrate 91. The low-noise amplifiers 21 to 23, the duplexers 61 and 66, and the switches 51 to 58 may be arranged on either the major surface 91a or 91b of the module substrate 91.

Although not illustrated in FIG. 2, interconnections forming the transmit paths AT to FT and the receive paths AR to FR illustrated in FIG. 1 are formed in the module substrate 91 and at the major surfaces 91a and 91b. The interconnections may be bonding wires with ends joined to the major surface 91a or 91b and any of the circuit elements constituting the radio-frequency module 1A, or connectors, electrodes, or wires that are formed on the surface of the circuit elements constituting the radio-frequency module 1A.

The metal shield layer 95 covers the surface of the resin member 92. The metal shield layer 95 is set at the ground potential. The metal shield layer 95 is, for example, a metal thin film formed by sputtering.

The metal shield plate 80 is an example of a first metal shield plate and a second metal shield plate. The metal shield plate 80 is a metal wall rising from the major surface 91a to the top surface of the resin member 92 on the front side in the positive direction of the Z axis. The metal shield plate 80 is in contact with a ground electrode at the major surface 91a and also with the metal shield layer 95. This means that the metal shield plate 80 is grounded at two points of the upper and lower portions. This makes the electromagnetic field blocking capability of the metal shield plate 80 stronger. The metal shield plate 80 is in contact with, of the shielding sides forming the metal shield layer 95, the shielding side on the top surface of the resin member 92 or the shielding sides on side surfaces of the resin member 92.

The metal shield plate 80 is disposed on the major surface 91a between the power amplifiers 11 and 12 and also between the power amplifiers 11 and 13, when the module substrate 91 is viewed in plan view.

With the configuration described above, the power amplifiers 11 and 12 are arranged across the metal shield plate 80 at the ground potential, and thus, it is possible to suppress degradation of the quality of transmit signal because harmonic waves of a transmit signal outputted from the power amplifier 11 are superimposed on a transmit signal outputted from the power amplifier 12. Similarly, the power amplifiers 11 and 13 are arranged across the metal shield plate 80 at the ground potential, and thus, it is possible to suppress degradation of the quality of transmit signal because harmonic waves of a transmit signal outputted from the power amplifier 11 are superimposed on a transmit signal outputted from the power amplifier 13.

The first metal shield plate is provided between the power amplifiers 11 and 12, and the second metal shield plate is provided between the power amplifiers 11 and 13; the first metal shield plate and the second metal shield plate may be formed by the single metal shield plate 80 as in this practical example or may be formed separately.

In the radio-frequency module 1A according to this practical example, when the module substrate 91 is viewed in plan view, the metal shield plate 80 is positioned between the first inductor of the matching network 31 and the second inductor of the matching network 32 and also between the first inductor of the matching network 31 and the third inductor of the matching network 33.

This arrangement inhibits electromagnetic field coupling between the first inductor and the second inductor and electromagnetic field coupling between the first inductor and the third inductor. As a result, it is possible to further inhibit harmonic waves of a transmit signal outputted from the power amplifier 11 from being superimposed on a transmit signal outputted from the power amplifier 12. It is also possible to further inhibit harmonic waves of a transmit signal outputted from the power amplifier 11 from being superimposed on a transmit signal outputted from the power amplifier 13.

In the radio-frequency module 1A according to this practical example, when the module substrate 91 is viewed in plan view, the metal shield plate 80 is positioned between the first inductor of the matching network 31 and the fourth inductor of the matching network 42 and also between the first inductor of the matching network 31 and the fifth inductor of the matching network 43.

This arrangement inhibits electromagnetic field coupling between the first inductor and the fourth inductor and electromagnetic field coupling between the first inductor and the fifth inductor. As a result, it is possible to suppress degradation of the receive sensitivity of the second receive circuit or the third receive circuit because harmonic waves of a transmit signal outputted from the power amplifier 11 and spurious waves of intermodulation distortion between the transmit signal and other radio-frequency signals flow into the second receive circuit and the third receive circuit.

The metal shield plate 80 divides the major surface 91a into a region P (a first region and a third region) and a region Q (a second region and a fourth region). Specifically, the first metal shield plate that separates the power amplifiers 11 and 12 divides the major surface 91a into the first region and the second region, and the second metal shield plate that separates the power amplifiers 11 and 13 divides the major surface 91a into the third region and the fourth region. As illustrated in FIG. 2, the transmit filters 61T and 62T are arranged in the region P, and the transmit filters 63T, 64T, 65T, and 66T are arranged in the region Q.

This inhibits electromagnetic field coupling between the transmit filters 61T and 62T and the transmit filters 63T, 64T, 65T, and 66T. As a result, it is possible to suppress degradation of the quality of transmit signal because harmonic waves of a transmit signal of the low-band group is superimposed on a transmit signal of the middle-band group and a transmit signal of the high-band group.

Additionally, as illustrated in FIG. 2, the transmit filters 61T and 62T are arranged in the region P, and the receive filters 63R, 64R, 65R, and 66R are arranged in the region Q.

This arrangement inhibits electromagnetic field coupling between the transmit filters 61T and 62T and the receive filters 63R, 64R, 65R, and 66R. As a result, it is possible to suppress degradation of the receive sensitivity of the receive circuit for the middle-band group and the receive circuit for the high-band group because harmonic waves of a transmit signal of the low-band group and spurious waves of intermodulation distortion between the transmit signal and other radio-frequency signals flow into the receive circuit for the middle-band group and the receive circuit for the high-band group.

In the radio-frequency module 1A according to this practical example, the low-noise amplifier 21 and the switches 54 and 57 may be formed in one semiconductor IC 71. The low-noise amplifiers 22 and 23 and the switches 55, 56, and 58 may be formed in one semiconductor IC 72. In this manner, the size of the radio-frequency module 1A is reduced.

Between the metal shield plate 80 and the major surface 91a, a hole may be extended in the normal direction (the Y-axis direction) of the metal shield plate 80.

Because a hole is formed between the metal shield plate 80 and the major surface 91a, it is possible to obtain favorable mobility of a liquid resin near the metal shield plate 80 during the process of forming the resin member 92 on the major surface 91a. This configuration inhibits, for example, the creation of spaces without necessarily the resin member 92 formed near the metal shield plate 80.

Also, between the metal shield plate 80 and the top surface of the resin member 92, a hole may be extended in the normal direction (the Y-axis direction) of the metal shield plate 80.

Because a hole is formed between the metal shield plate 80 and the top surface, it is possible to obtain favorable mobility of a liquid resin near the metal shield plate 80 during the process of forming the resin member 92 on the major surface 91a. This configuration inhibits, for example, the creation of spaces without necessarily the resin member 92 formed near the metal shield plate 80.

The metal shield plate 80 may be a plurality of metal plates discretely arranged.

Because spaces are formed between the plurality of metal plates, it is possible to obtain favorable mobility of a liquid resin near the metal shield plate 80 during the process of forming the resin member 92 on the major surface 91a.

Figure 3:
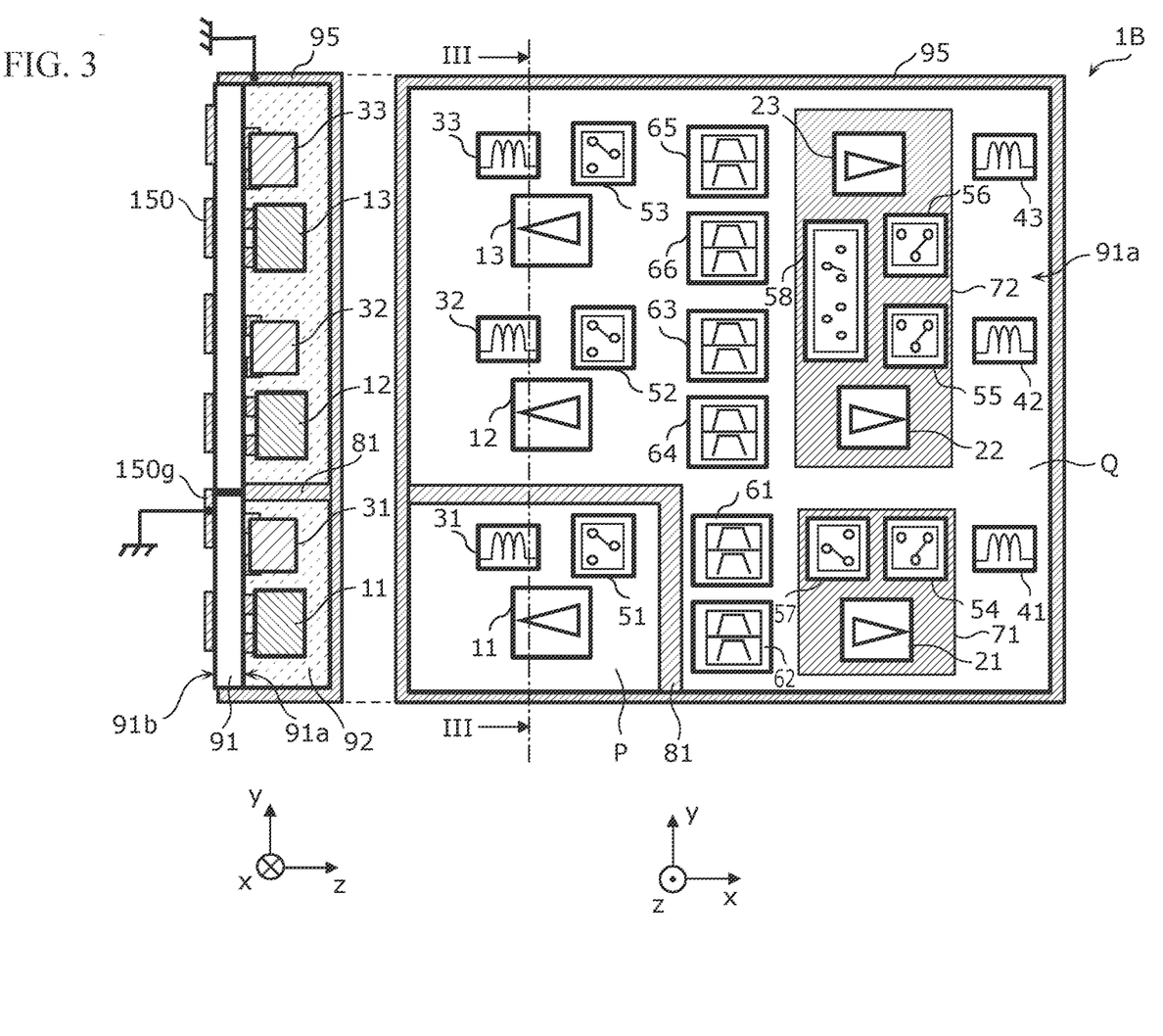
FIG. 3 provides a plan view and a sectional view of a radio-frequency module according to a second practical example.

3 Arrangement of Circuit Components of Radio-Frequency Module 1B According to Second Practical Example FIG. 3 provides a plan view and a sectional view of a radio-frequency module 1B according to a second practical example. The right side of FIG. 3 provides a drawing illustrating an arrangement of circuit components when a major surface 91a of a module substrate 91 is viewed from the front side in the positive direction of the Z axis. The left side of FIG. 3 provides a sectional view taken along line III-III in the right drawing in FIG. 3. The radio-frequency module 1B specifically presents an arrangement of the circuit components of the radio-frequency module 1 according to the embodiment. The radio-frequency module 1B according to this practical example differs from the radio-frequency module 1A according to the first practical example in the position of a metal shield plate 81. The following describes the radio-frequency module 1B according to this practical example with a main focus on points different from the radio-frequency module 1A according to the first practical example, and descriptions of the same points as the radio-frequency module 1A according to the first practical example are not repeated.

As illustrated in FIG. 3, the radio-frequency module 1B according to this practical example includes, as well as the circuit configuration illustrated in FIG. 1, the module substrate 91, the metal shield plate 81, a metal shield layer 95, a resin member 92, and external connection terminals 150.

As illustrated in FIG. 3, in the radio-frequency module 1B according to this practical example, the power amplifiers 11 to 13, the low-noise amplifiers 21 to 23, the duplexers 61 and 66, the matching networks 31 to 33 and 41 to 43, and the switches 51 to 58 are arranged on the major surface 91a of the module substrate 91. The low-noise amplifiers 21 to 23, the duplexers 61 and 66, and the switches 51 to 58 may be arranged on either the major surface 91a or a major surface 91b of the module substrate 91.

The metal shield plate 81 is an example of the first metal shield plate and the second metal shield plate. The metal shield plate 81 is a metal wall rising from the major surface 91a to the top surface of the resin member 92 on the front side in the positive direction of the Z axis. The metal shield plate 81 is in contact with a ground electrode at the major surface 91a and also with the metal shield layer 95. This means that the metal shield plate 81 is grounded at two points of the upper and lower portions. This makes the electromagnetic field blocking capability of the metal shield plate 81 stronger. The metal shield plate 81 is in contact with, of the shielding sides forming the metal shield layer 95, the shielding side on the top surface of the resin member 92 or the shielding sides on side surfaces of the resin member 92.

The metal shield plate 81 is disposed on the major surface 91a between the power amplifiers 11 and 12 and also between the power amplifiers 11 and 13, when the module substrate 91 is viewed in plan view.

With the configuration described above, it is possible to suppress degradation of the quality of transmit signal because harmonic waves of a transmit signal outputted from the power amplifier 11 are superimposed on a transmit signal outputted from the power amplifier 12. Furthermore, it is possible to suppress degradation of the quality of transmit signal because harmonic waves of a transmit signal outputted from the power amplifier 11 are superimposed on a transmit signal outputted from the power amplifier 13.

In the radio-frequency module 1B according to this practical example, when the module substrate 91 is viewed in plan view, the metal shield plate 81 is positioned between the first inductor of the matching network 31 and the second inductor of the matching network 32 and also between the first inductor of the matching network 31 and the third inductor of the matching network 33.

This arrangement inhibits electromagnetic field coupling between the first inductor and the second inductor and electromagnetic field coupling between the first inductor and the third inductor.

In the radio-frequency module 1B according to this practical example, when the module substrate 91 is viewed in plan view, the metal shield plate 81 is positioned between the first inductor of the matching network 31 and the fourth inductor of the matching network 42 and also between the first inductor of the matching network 31 and the fifth inductor of the matching network 43.

This arrangement inhibits electromagnetic field coupling between the first inductor and the fourth inductor and electromagnetic field coupling between the first inductor and the fifth inductor.

The metal shield plate 81 divides the major surface 91a into a region P (the first region and the third region) and a region Q (the second region and the fourth region). Specifically, the first metal shield plate that separates the power amplifiers 11 and 12 divides the major surface 91a into the first region and the second region, and the second metal shield plate that separates the power amplifiers 11 and 13 divides the major surface 91a into the third region and the third region.

As illustrated in FIG. 3, the power amplifier 11 and the matching network 31 are arranged in the region P, and the receive filters 63R, 64R, 65R, and 66R are arranged in the region Q.

This arrangement inhibits electromagnetic field coupling between the power amplifier 11 and the receive filters 63R, 64R, 65R, and 66R. As a result, it is possible to suppress degradation of the receive sensitivity of the receive circuit for the middle-band group and the receive circuit for the high-band group because harmonic waves of a transmit signal of the low-band group and spurious waves of intermodulation distortion between the transmit signal and other radio-frequency signals flow into the receive circuit for the middle-band group and the receive circuit for the high-band group.

Figure 4A:
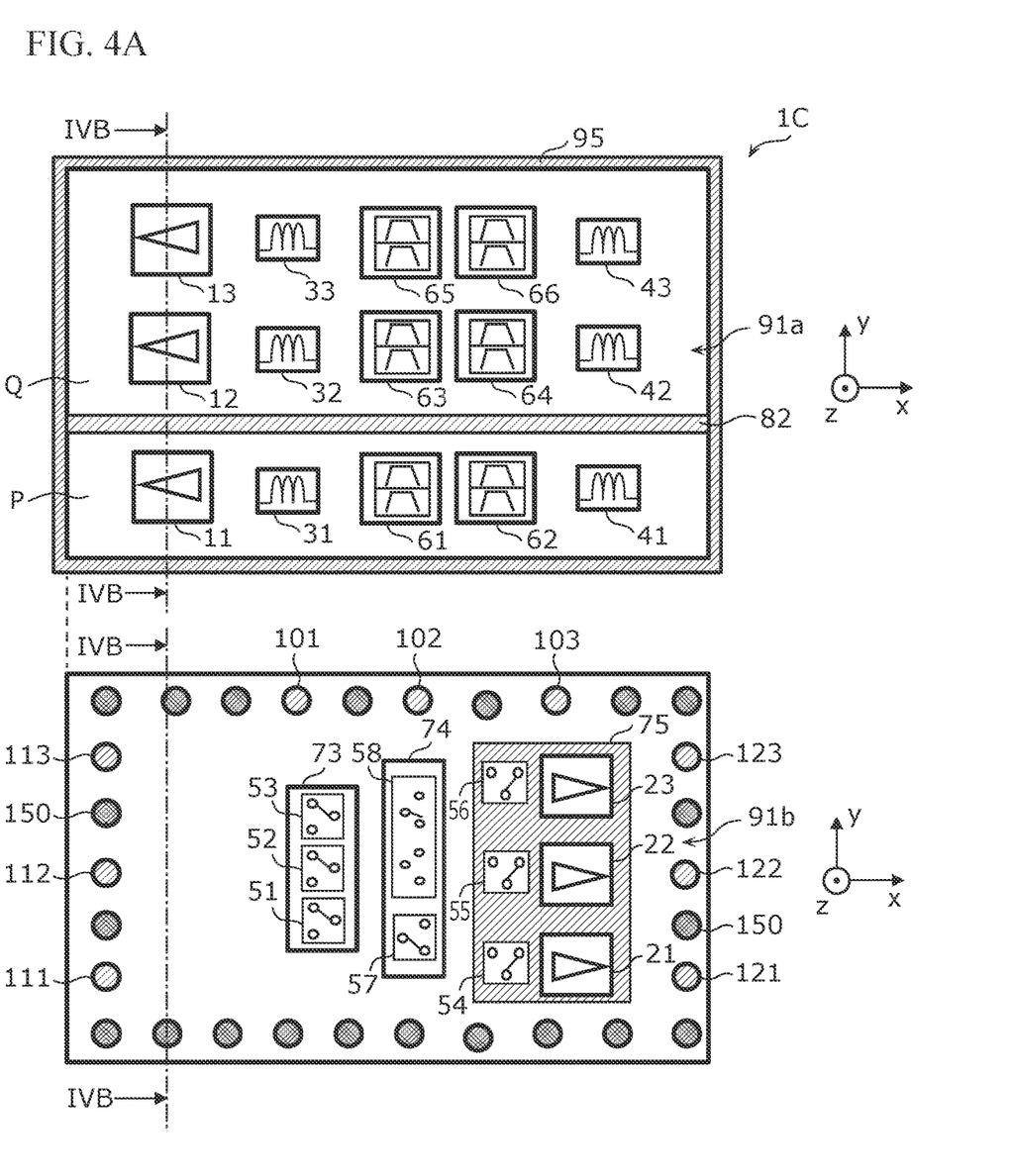
FIG. 4A provides plan views of a radio-frequency module according to a third practical example.
Figure 4B:
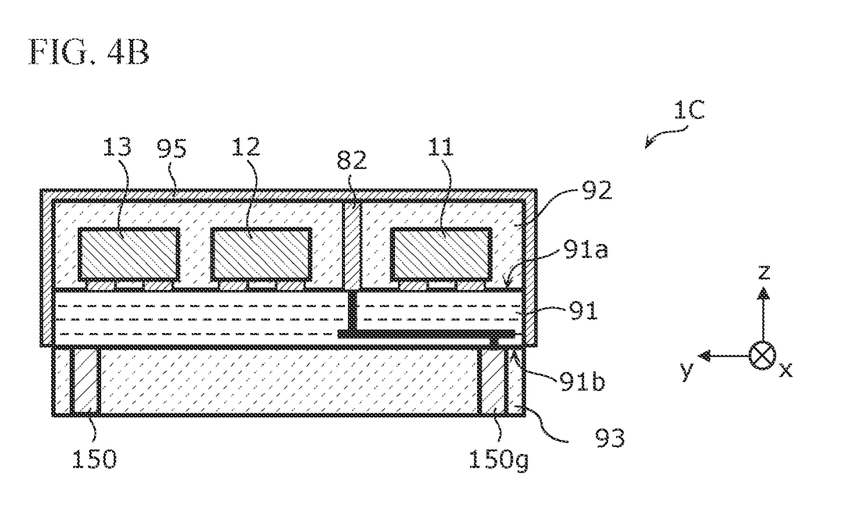
FIG. 4B is a sectional view of the radio-frequency module according to the third practical example.

4 Arrangement of Circuit Components of Radio-Frequency Module 1C According to Third Practical Example FIG. 4A provides plan views of a radio-frequency module 1C according to a third practical example. FIG. 4B is a sectional view of the radio-frequency module 1C according to the third practical example, more specifically, a sectional view taken along line IVB-IVB in FIG. 4A. The upper part of FIG. 4A illustrates an arrangement of circuit elements when, of major surfaces 91a and 91b opposite to each other in a module substrate 91, the major surface 91a is viewed from the front side in the positive direction of the Z axis. The lower part of FIG. 4A provides a cutaway view of the arrangement of circuit elements when the major surface 91b is viewed from the front side in the positive direction of the Z axis.

The radio-frequency module 1C according to the third practical example specifically presents an arrangement of the circuit elements of the radio-frequency module 1 according to the embodiment. The radio-frequency module 1C according to this practical example differs from the radio-frequency module 1A according to the first practical example in that the circuit components constituting the radio-frequency module 1C are arranged on both sides of the module substrate 91. The following describes the radio-frequency module 1C according to this practical example with a main focus on points different from the radio-frequency module 1A according to the first practical example, and descriptions of the same points as the radio-frequency module 1A according to the first practical example are not repeated.

As illustrated in FIGS. 4A and 4B, the radio-frequency module 1C according to this practical example includes, as well as the circuit configuration illustrated in FIG. 1, the module substrate 91, a metal shield plate 82, a metal shield layer 95, resin members 92 and 93, and external connection terminals 150.

The module substrate 91 has the major surface 91a (the first major surface) and the major surface 91b (a second major surface); the first to third transfer circuits are provided at the major surfaces 91a and 91b.

The resin member 92 is disposed on the major surface 91a of the module substrate 91 to cover at least a portion of the circuit components forming the first to third transfer circuits and also cover the major surface 91a. The resin member 92 functions to secure the reliability including, for example, the mechanical strength and moisture resistance of the circuit components. The resin member 93 is disposed on the major surface 91b to cover at least a portion of the circuit components forming the first to third transfer circuits and also cover the major surface 91b. The resin member 93 functions to secure the reliability including, for example, the mechanical strength and moisture resistance of the circuit components.

The external connection terminals 150 are disposed on the major surface 91b of the module substrate 91. The radio-frequency module 1C exchanges electrical signals with an external substrate provided on the front side in the negative direction of the Z axis with respect to the radio-frequency module 1C, through the plurality of external connection terminals 150. A ground terminal 150g of the plurality of external connection terminals 150 is set at a ground potential of the external substrate. The external connection terminals 150 may be planar electrodes formed on the major surface 91b as illustrated in FIG. 4B or may be bump electrodes formed on the major surface 91b. When the external connection terminals 150 are formed by bump electrodes, the resin member 93 is not necessarily included.

Although not illustrated in FIGS. 4A and 4B, interconnections forming the transmit paths AT, BT, and CT and the receive paths AR, BR, and CR illustrated in FIG. 1 are formed in the module substrate 91 and at the major surfaces 91a and 91b. The interconnections may be bonding wires with ends joined to the major surface 91a or 91b and any of the circuit elements constituting the radio-frequency module 1C, or connectors, electrodes, or wires that are formed on the surface of the circuit elements constituting the radio-frequency module 1C.

As illustrated in FIG. 4A, the external connection terminals 150 include the antenna connection terminals 101, 102, and 103, the transmit input terminals 111, 112, and 113, and the receive output terminals 121, 122, and 123. Some of the external connection terminals 150 are set at the ground potential of the external substrate.

As illustrated in FIG. 4A, in the radio-frequency module 1C according to this practical example, the power amplifiers 11 to 13, the duplexers 61 and 66, the matching networks 31 to 33 and 41 to 43 are arranged on the major surface 91a of the module substrate 91. The low-noise amplifiers 21 to 23 and the switches 51 to 58 are arranged on the major surface 91b of the module substrate 91.

In this manner, the power amplifiers 11 to 13 and the low-noise amplifiers 21 to 23 are separately provided on both sides of the module substrate 91, and as a result, isolation between the transmit side and the receive side becomes stronger.

It is desirable that the module substrate 91 have a multilayer structure including a plurality of dielectric layers stacked, and a ground electrode pattern be formed at least one of the plurality of dielectric layers. This improves the electromagnetic field blocking capability of the module substrate 91.

The metal shield plate 82 is an example of the first metal shield plate and the second metal shield plate. The metal shield plate 82 is a metal wall rising from the major surface 91a to the top surface of the resin member 92 on the front side in the positive direction of the Z axis. The metal shield plate 82 is in contact with a ground electrode at the major surface 91a and also with the metal shield layer 95. This means that the metal shield plate 82 is grounded at two points of the upper and lower portions. This makes the electromagnetic field blocking capability of the metal shield plate 82 stronger. The metal shield plate 82 is in contact with, of the shielding sides forming the metal shield layer 95, the shielding side on the top surface of the resin member 92 or the shielding sides on side surfaces of the resin member 92.

The metal shield plate 82 is disposed on the major surface 91a between the power amplifiers 11 and 12 and also between the power amplifiers 11 and 13, when the module substrate 91 is viewed in plan view.

With the configuration described above, it is possible to suppress degradation of the quality of transmit signal because harmonic waves of a transmit signal outputted from the power amplifier 11 are superimposed on a transmit signal outputted from the power amplifier 12. Furthermore, it is possible to suppress degradation of the quality of transmit signal because harmonic waves of a transmit signal outputted from the power amplifier 11 are superimposed on a transmit signal outputted from the power amplifier 13.

The first metal shield plate is provided between the power amplifiers 11 and 12, and the second metal shield plate is provided between the power amplifiers 11 and 13; the first metal shield plate and the second metal shield plate may be formed as the single metal shield plate 82 as in this practical example or may be formed separately.

In the radio-frequency module 1C according to this practical example, when the module substrate 91 is viewed in plan view, the metal shield plate 82 is positioned between the first inductor of the matching network 31 and the second inductor of the matching network 32 and also between the first inductor of the matching network 31 and the third inductor of the matching network 33.

This arrangement inhibits electromagnetic field coupling between the first inductor and the second inductor and electromagnetic field coupling between the first inductor and the third inductor. As a result, it is possible to further inhibit harmonic waves of a transmit signal outputted from the power amplifier 11 from being superimposed on a transmit signal outputted from the power amplifier 12. It is also possible to further inhibit harmonic waves of a transmit signal outputted from the power amplifier 11 from being superimposed on a transmit signal outputted from the power amplifier 13.

In the radio-frequency module 1C according to this practical example, when the module substrate 91 is viewed in plan view, the metal shield plate 82 is positioned between the first inductor of the matching network 31 and the fourth inductor of the matching network 42 and also between the first inductor of the matching network 31 and the fifth inductor of the matching network 43.

This arrangement inhibits electromagnetic field coupling between the first inductor and the fourth inductor and electromagnetic field coupling between the first inductor and the fifth inductor. As a result, it is possible to suppress degradation of the receive sensitivity of the second receive circuit or the third receive circuit because harmonic waves of a transmit signal outputted from the power amplifier 11 and spurious waves of intermodulation distortion between the transmit signal and other radio-frequency signals flow into the second receive circuit and the third receive circuit.

The metal shield plate 82 divides the major surface 91a into a region P (the first region and the third region) and a region Q (the second region and the fourth region). Specifically, the first metal shield plate that separates the power amplifiers 11 and 12 divides the major surface 91a into the first region and the second region, and the second metal shield plate that separates the power amplifiers 11 and 13 divides the major surface 91a into the third region and the fourth region. As illustrated in FIG. 4A, the transmit filters 61T and 62T are arranged in the region P, and the transmit filters 63T, 64T, 65T, and 66T are arranged in the region Q.

This arrangement inhibits electromagnetic field coupling between the transmit filters 61T and 62T and the transmit filters 63T, 64T, 65T, and 66T. As a result, it is possible to suppress degradation of the quality of transmit signal because harmonic waves of a transmit signal of the low-band group is superimposed on a transmit signal of the middle-band group and a transmit signal of the high-band group.

Additionally, as illustrated in FIG. 4A, the transmit filters 61T and 62T are arranged in the region P, and the receive filters 63R, 64R, 65R, and 66R are arranged in the region Q.

This arrangement inhibits electromagnetic field coupling between the transmit filters 61T and 62T and the receive filters 63R, 64R, 65R, and 66R. As a result, it is possible to suppress degradation of the receive sensitivity of the receive circuit for the middle-band group and the receive circuit for the high-band group because harmonic waves of a transmit signal of the low-band group and spurious waves of intermodulation distortion between the transmit signal and other radio-frequency signals flow into the receive circuit for the middle-band group and the receive circuit for the high-band group.

In the radio-frequency module 1C according to this practical example, the low-noise amplifiers 21 to 23 and the switches 54 to 56 may be formed in one semiconductor IC 75. The switches 57 and 58 may be formed in one semiconductor IC 74. The switches 51 to 53 may be formed in one semiconductor IC 73. In this manner, the size of the radio-frequency module 1C is reduced.

In the radio-frequency module 1C according to this practical example, the power amplifiers 11 to 13 are arranged on the major surface 91a. The amount of heat generation of the power amplifiers 11 to 13 is relatively large among the circuit components included in the radio-frequency module 1C. To enhance the heat dissipation capability of the radio-frequency module 1C, it is suitable to dissipate heat generated in the power amplifiers 11 to 13 along heat dissipation paths of a low thermal resistance to an external substrate. If the power amplifiers 11 to 13 are arranged on the major surface 91b, electrode wires coupled to the power amplifiers 11 to 13 are arranged on the major surface 91b. As a result, the heat dissipation paths include heat dissipation paths routed via only planar interconnection patterns (along an xy plane) on the major surface 91b. The planar interconnection patterns are formed by a metal thin film, and thus, the thermal resistance of the planar interconnection patterns is relatively high. As a result, if the power amplifiers 11 to 13 are arranged on the major surface 91b, the heat dissipation capability is degraded.

By contrast, when the power amplifiers 11 to 13 are arranged on the major surface 91a as in this practical example, the power amplifiers 11 to 13 and the external connection terminals 150 can be coupled to each other by through electrodes extended between the major surfaces 91a and 91b. As such, the heat dissipation paths of the power amplifiers 11 to 13 do not include heat dissipation paths routed via only planar interconnection patterns along an xy plane, the thermal resistance of which is relatively high among the interconnections in the module substrate 91. As a result, it is possible to provide the radio-frequency module 1C of a reduced size with an improved capability of dissipating heat from the power amplifiers 11 to 13 to an external substrate.

In the radio-frequency module 1C according to the practical example, it is desirable that as illustrated in FIGS. 4A and 4B, when the module substrate 91 is viewed in plan view, no circuit component be formed in a region of the major surface 91b opposite to the region of the major surface 91a having the power amplifiers 11 to 13.

With this configuration, it is possible to avoid malfunction or damage of the circuit component due to temperature rises caused by heat generated in the power amplifiers 11 to 13.

5 Effects

As described above, the radio-frequency module 1A according to the first practical example includes the module substrate 91 having the major surface 91a, the power amplifier 11 disposed on the major surface 91a, the power amplifier 12 disposed on the major surface 91a, the power amplifier 13 disposed on the major surface 91a, the transmit filter 61T coupled to the output terminal of the power amplifier 11 and configured to pass a transmit signal in the communication band A, the transmit filter 63T coupled to the output terminal of the power amplifier 12 and configured to pass a transmit signal in the communication band C, the transmit filter 65T coupled to the output terminal of the power amplifier 13 and configured to pass a transmit signal in the communication band E, the resin member 92 that covers at least a portion of the major surface 91a, the metal shield layer 95 that covers the surface of the resin member 92 and that is set at the ground potential, and the metal shield plate 80 disposed on the major surface 91a between the power amplifiers 11 and 12 and also between the power amplifiers 11 and 13, when the module substrate 91 is viewed in plan view. The metal shield plate 80 is in contact with a first ground electrode at the major surface 91a and also with the metal shield layer 95.

With the configuration described above, the power amplifiers 11 and 12 are arranged across the metal shield plate 80 at the ground potential, and thus, it is possible to suppress degradation of the quality of transmit signal because harmonic waves of a transmit signal outputted from the power amplifier 11 are superimposed on a transmit signal outputted from the power amplifier 12. Similarly, the power amplifiers 11 and 13 are arranged across the metal shield plate 80 at the ground potential, and thus, it is possible to suppress degradation of the quality of transmit signal because harmonic waves of a transmit signal outputted from the power amplifier 11 are superimposed on a transmit signal outputted from the power amplifier 13.

The radio-frequency module 1A may further include the first inductor of the matching network 31 disposed on the major surface 91a and coupled between the power amplifier 11 and the transmit filter 61T, the second inductor of the matching network 32 disposed on the major surface 91a and coupled between the power amplifier 12 and the transmit filter 63T, and the third inductor of the matching network 33 disposed on the major surface 91a and coupled between the power amplifier 13 and the transmit filter 65T. In the plan view, the metal shield plate 80 may be provided between the first inductor and the second inductor and also between the first inductor and the third inductor.

This arrangement inhibits electromagnetic field coupling between the first inductor and the second inductor and electromagnetic field coupling between the first inductor and the third inductor. As a result, it is possible to further inhibit harmonic waves of a transmit signal outputted from the power amplifier 11 from being superimposed on a transmit signal outputted from the power amplifier 12. It is also possible to further inhibit harmonic waves of a transmit signal outputted from the power amplifier 11 from being superimposed on a transmit signal outputted from the power amplifier 13.

The radio-frequency module 1A may further include the low-noise amplifiers 22 and 23, the receive filter 63R configured to pass a receive signal in the communication band C, the receive filter 65R configured to pass a receive signal in the communication band E, the fourth inductor of the matching network 42 disposed on the major surface 91a and coupled between the low-noise amplifier 22 and the receive filter 63R, and the fifth inductor of the matching network 43 disposed on the major surface 91a and coupled between the low-noise amplifier 23 and the receive filter 65R. In the plan view, the metal shield plate 80 may be provided between the first inductor and the fourth inductor and also between the first inductor and the fifth inductor.

This arrangement inhibits electromagnetic field coupling between the first inductor and the fourth inductor and electromagnetic field coupling between the first inductor and the fifth inductor. As a result, it is possible to suppress degradation of the receive sensitivity of the second receive circuit or the third receive circuit because harmonic waves of a transmit signal outputted from the power amplifier 11 and spurious waves of intermodulation distortion between the transmit signal and other radio-frequency signals flow into the second receive circuit and the third receive circuit.

In the radio-frequency module 1A, the metal shield plate 80 may divide the major surface 91a into the region P and the region Q in the plan view; the transmit filter 61T may be positioned in the region P, and the transmit filters 63T and 65T may be positioned in the region Q.

This arrangement inhibits electromagnetic field coupling between the transmit filter 61T, and the transmit filters 63T and 65T. As a result, it is possible to suppress degradation of the quality of transmit signal because harmonic waves of a transmit signal of the low-band group is superimposed on a transmit signal of the middle-band group and a transmit signal of the high-band group.

The radio-frequency module 1A according to the first practical example includes the module substrate 91 having the major surface 91a, the power amplifier 11 disposed on the major surface 91a, the power amplifier 12 disposed on the major surface 91a, the power amplifier 13 disposed on the major surface 91a, the transmit filter 61T configured to pass a transmit signal in the communication band A, the receive filter 63R configured to pass a receive signal in the communication band C, the receive filter 65R configured to pass a receive signal in the communication band E, the first inductor of the matching network 31 disposed on the major surface 91a and coupled between the power amplifier 11 and the transmit filter 61T, the fourth inductor of the matching network 42 disposed on the major surface 91a and coupled between the low-noise amplifier 22 and the receive filter 63R, the fifth inductor disposed on the major surface 91a and coupled between the low-noise amplifier 23 and the receive filter 65R, the resin member 92 that covers at least a portion of the major surface 91a, the metal shield layer 95 that covers the surface of the resin member 92 and that is set at the ground potential, and the metal shield plate 80 disposed on the major surface 91a between the first inductor and the fourth inductor and also between the first inductor and the fifth inductor when the module substrate 91 is viewed in plan view. The metal shield plate 80 is in contact with the first ground electrode at the major surface 91a and also with the metal shield layer 95.

This arrangement inhibits electromagnetic field coupling between the first inductor and the fourth inductor and electromagnetic field coupling between the first inductor and the fifth inductor. As a result, it is possible to suppress degradation of the receive sensitivity of the second receive circuit or the third receive circuit because harmonic waves of a transmit signal outputted from the power amplifier 11 and spurious waves of intermodulation distortion between the transmit signal and other radio-frequency signals flow into the second receive circuit and the third receive circuit.

In the radio-frequency module 1A, the metal shield plate 80 may divide the major surface 91a into the region P and the region Q in the plan view; the transmit filter 61T may be positioned in the region P, and the receive filters 63R and 65R may be positioned in the region Q.

This arrangement inhibits electromagnetic field coupling between the transmit filter 61T, and the receive filters 63R and 65R. As a result, it is possible to suppress degradation of the receive sensitivity of the receive circuit for the middle-band group and the receive circuit for the high-band group because harmonic waves of a transmit signal of the low-band group and spurious waves of intermodulation distortion between the transmit signal and other radio-frequency signals flow into the receive circuit for the middle-band group and the receive circuit for the high-band group.

In the radio-frequency module 1C according to the third practical example, the module substrate 91 may further include the major surface 91b opposite to the major surface 91a. The radio-frequency module 1C may further include the plurality of external connection terminals 150 arranged at the major surface 91b. The low-noise amplifiers 22 and 23 may be disposed on the major surface 91b.

In this manner, the power amplifier 11 and the low-noise amplifiers 22 and 23 are separately provided on both sides of the module substrate 91, and as a result, isolation between the transmit side and the receive side becomes stronger. As a result, it is possible to suppress degradation of the receive sensitivity of the second receive circuit or the third receive circuit because harmonic waves of a transmit signal outputted from the power amplifier 11 and spurious waves of intermodulation distortion between the transmit signal and other radio-frequency signals flow into the second receive circuit and the third receive circuit.

The communication band C may include the frequency of an mth (m is an integer greater than or equal to 2) harmonic wave of a signal in the communication band A. The communication band E may include the frequency of an nth (n is an integer greater than or equal to 2) harmonic wave of a signal in the communication band A.

In the radio-frequency module 1A, the metal shield plate 80 may be formed by the first metal shield plate provided between the power amplifiers 11 and 12 and the second metal shield plate provided between the power amplifiers 11 and 13.

The communication device 5 includes the RFIC 3 configured to process a radio-frequency signal received or to be transmitted by the antennas 2a to 2c and the radio-frequency module 1 configured to transfer the radio-frequency signal between the antennas 2a to 2c and the RFIC 3.

With this configuration, it is possible to provide the communication device 5 in which deterioration of the quality of transmit signal or receive signal is suppressed.

Other Embodiments

The above has described the radio-frequency module and communication device according to the present disclosure by using the embodiment and practical examples, but the radio-frequency module and communication device according to the present disclosure are not limited to the embodiment and practical examples described above. The present disclosure also embraces other embodiments implemented as any combination of the constituent elements of the embodiment and practical examples, other modified examples obtained by making various modifications that occur to those skilled in the art without necessarily departing from the scope of the embodiment and practical example described above, and various hardware devices including the radio-frequency module and communication device.

For example, in the radio-frequency module and communication device according to the embodiment and practical examples described above, other circuit elements and interconnections may be inserted in the paths connecting the circuit elements and signal paths that are illustrated in the drawings.

INDUSTRIAL APPLICABILITY

The present disclosure is operable as a multiband radio-frequency module provided at the front-end in a wide variety of communication devices such as mobile phones.

REFERENCE SIGNS LIST 1, 1A, 1B, 1C radio-frequency module
2a, 2b, 2c antenna
3 RF signal processing circuit (RFIC)
4 baseband signal processing circuit (BBIC)
5 communication device
11, 12, 13 power amplifier
21, 22, 23 low-noise amplifier
31, 32, 33, 41, 42, 43 matching network
51, 52, 53, 54, 55, 56, 57, 58 switch
61, 62, 63, 64, 65, 66 duplexer
61R, 62R, 63R, 64R, 65R, 66R receive filter
61T, 62T, 63T, 64T, 65T, 66T transmit filter
71, 72, 73, 74, 75 semiconductor IC
80, 81, 82 metal shield plate
91 module substrate
91a, 91b major surface
92, 93 resin member
95 metal shield layer
101, 102, 103 antenna connection terminal
111, 112, 113 transmit input terminal
121, 122, 123 receive output terminal
150 external connection terminal
150g ground terminal
AR, BR, CR, DR, ER, FR receive path
AT, BT, CT, DT, ET, FT transmit path
P, Q region

The invention claimed is:

1. A radio-frequency module comprising:
a module substrate having a first major surface;
a first power amplifier on the first major surface;
a second power amplifier on the first major surface;
a third power amplifier on the first major surface;
a first filter coupled to an output terminal of the first power amplifier, the first filter being configured to pass a transmit signal in a first communication band;
a second filter coupled to an output terminal of the second power amplifier, the second filter being configured to pass a transmit signal in a second communication band that is different from the first communication band;
a third filter coupled to an output terminal of the third power amplifier, the third filter being configured to pass a transmit signal in a third communication band that is different from the first communication band and the second communication band;
resin covering at least a portion of the first major surface;
a metal shield layer covering a surface of the resin, the metal shield layer being at a ground potential;
a first metal shield plate on the first major surface between the first power amplifier and the second power amplifier, as seen in a plan view of the module substrate; and
a second metal shield plate on the first major surface between the first power amplifier and the third power amplifier, as seen in the plan view,
wherein the first metal shield plate is in contact with a first ground electrode at the first major surface, and is in contact with the metal shield layer, and
wherein the second metal shield plate is in contact with a second ground electrode at the first major surface, and is in contact with the metal shield layer.

2. The radio-frequency module according to claim 1, further comprising:
a first inductor on the first major surface, the first inductor being coupled between the first power amplifier and the first filter;
a second inductor on the first major surface, the second inductor being coupled between the second power amplifier and the second filter; and
a third inductor on the first major surface, the third inductor being coupled between the third power amplifier and the third filter,
wherein the first metal shield plate is between the first inductor and the second inductor in the plan view, and
wherein the second metal shield plate is between the first inductor and the third inductor in the plan view.

3. The radio-frequency module according to claim 2, further comprising:
a second low-noise amplifier;
a third low-noise amplifier;
a fourth filter configured to pass a receive signal in the second communication band;
a fifth filter configured to pass a receive signal in the third communication band;
a fourth inductor on the first major surface, the fourth inductor being coupled between the second low-noise amplifier and the fourth filter; and
a fifth inductor on the first major surface, the fifth inductor being coupled between the third low-noise amplifier and the fifth filter,
wherein the first metal shield plate is between the first inductor and the fourth inductor in the plan view, and wherein the second metal shield plate is between the first inductor and the fifth inductor in the plan view.

4. The radio-frequency module according to claim 3, wherein the module substrate further has a second major surface that is opposite to the first major surface,
wherein the radio-frequency module further comprises a plurality of external connection terminals on the second major surface, and
wherein the second low-noise amplifier and the third low-noise amplifier are on the second major surface.

5. The radio-frequency module according to claim 1, wherein the first metal shield plate divides the first major surface into a first region and a second region in the plan view,
wherein the second metal shield plate divides the first major surface into a third region and a fourth region in the plan view,
wherein the first filter is in the first region and the third region,
wherein the second filter is in the second region, and
wherein the third filter is in the fourth region.

6. The radio-frequency module according to claim 1, wherein the second communication band comprises a frequency of a second or greater harmonic wave of a signal in the first communication band, and
the third communication band comprises a frequency of a second or greater harmonic wave of a signal in the first communication band.

7. The radio-frequency module according to claim 1, wherein the first metal shield plate and the second metal shield plate are a single metal shield plate.

8. A communication device comprising:
a radio-frequency (RF) signal processing circuit configured to process a radio-frequency signal received or transmitted by an antenna; and
the radio-frequency module according to claim 1, the radio-frequency module being configured to transfer the radio-frequency signal between the antenna and the RF signal processing circuit.

9. A radio-frequency module comprising:
a module substrate having a first major surface;
a first power amplifier on the first major surface;
a second low-noise amplifier on the first major surface;
a third low-noise amplifier on the first major surface;
a first filter configured to pass a transmit signal in a first communication band;
a fourth filter configured to pass a receive signal in a second communication band that is different from the first communication band;
a fifth filter configured to pass a receive signal in a third communication band that different from the first communication band and the second communication band;
a first inductor on the first major surface, the first inductor being coupled between the first power amplifier and the first filter;
a fourth inductor on the first major surface, the fourth inductor being coupled between the second low-noise amplifier and the fourth filter;
a fifth inductor on the first major surface, the fifth inductor being coupled between the third low-noise amplifier and the fifth filter;
resin covering at least a portion of the first major surface;
a metal shield layer covering a surface of the resin, the metal shield layer being at a ground potential;
a first metal shield plate on the first major surface between the first inductor and the fourth inductor, as seen in a plan view of the module substrate; and
a second metal shield plate on the first major surface between the first inductor and the fifth inductor, as seen in the plan view,
wherein the first metal shield plate is in contact with a first ground electrode at the first major surface, and is in contact with the metal shield layer, and
wherein the second metal shield plate is in contact with a second ground electrode at the first major surface, and is in contact with the metal shield layer.

10. The radio-frequency module according to claim 9, wherein the module substrate further has a second major surface that is opposite to the first major surface,
wherein the radio-frequency module further comprises a plurality of external connection terminals on the second major surface, and
wherein the second low-noise amplifier and the third low-noise amplifier are on the second major surface.

11. The radio-frequency module according to claim 9, wherein the first metal shield plate divides the first major surface into a first region and a second region in the plan view,
wherein the second metal shield plate divides the first major surface into a third region and a fourth region in the plan view,
wherein the first filter is in the first region and the third region,
wherein the fourth filter is in the second region, and
wherein the fifth filter is in the fourth region.

* * * * *